(12) United States Patent
Hong

(10) Patent No.: US 8,872,317 B2
(45) Date of Patent: Oct. 28, 2014

(54) STACKED PACKAGE

(75) Inventor: Young-Seok Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 13/093,123

(22) Filed: Apr. 25, 2011

(65) Prior Publication Data
US 2011/0298129 A1 Dec. 8, 2011

(30) Foreign Application Priority Data
Jun. 8, 2010 (KR) .................. 10-2010-0053643

(51) Int. Cl.
*H01L 23/02* (2006.01)
*H01L 23/48* (2006.01)
(Continued)

(52) U.S. Cl.
CPC ............ *H01L 24/49* (2013.01); *H01L 23/3135* (2013.01); *H01L 2924/15311* (2013.01); *H01L*
(Continued)

(58) Field of Classification Search
CPC .................. H01L 2924/00; H01L 2224/48227; H01L 2224/73265; H01L 2224/32224; H01L 2924/00014; H01L 25/0657; H01L 25/18; H01L 23/481; H01L 24/73; H01L 23/642; H01L 23/49822; H01L 21/56; H01L 23/49816; H01L 23/552; H01L 25/50; H01L 23/13; H01L 25/105; H01L 24/16; H01L 24/45; H01L 24/48; H01L 24/49; H01L 25/03; H01L 23/3135; H01L 23/3128; H01L 2224/16227; H01L 2224/32145; H01L 2224/45124; H01L 2224/45144; H01L 2224/48091; H01L 2224/48228; H01L 2224/4911; H01L 2224/49175; H01L 2225/0651; H01L 2225/06517; H01L 2225/06565; H01L 2924/01013; H01L 2924/01079; H01L 2924/078; H01L 2924/15311; H01L 2924/15321; H01L 2924/15331; H01L 2924/19107; H01L 2224/16225; H01L 2924/014; H01L 2924/01033; H01L 23/48
USPC .................. 257/686, 738, 780, 784, E23.021, 257/E23.069, 777, E23.068, E23.141, 257/E25.006, E25.013; 361/729, 735, 784, 361/792, 790
See application file for complete search history.

(56) References Cited

U.S. PATENT DOCUMENTS

| 6,476,506 | B1 * | 11/2002 | O'Connor et al. ............ 257/786 |
| 6,552,907 | B1 * | 4/2003 | Caldwell ........................ 361/708 |
| 7,034,388 | B2 * | 4/2006 | Yang et al. .................... 257/686 |

(Continued)

FOREIGN PATENT DOCUMENTS

| JP | 2006-216911 | 8/2006 |
| JP | 2008-34762 | 2/2008 |

OTHER PUBLICATIONS

Phipps, Gregory, "Wire Bond Vs. Flip Chip Packaging," Jul. 2005, Extension Media, Advanced Interconnect Technologies, http://electroiq.com/blog/2005/07/wire-bond-vs-flip-chip-packaging/.*

*Primary Examiner* — Teresa M Arroyo
(74) *Attorney, Agent, or Firm* — Onello & Mello, LLP

(57) ABSTRACT

A stacked package for an electronic device and a method of manufacturing the stacked package include a first semiconductor package being formed with a first conductive pad and a second conductive pad. A second semiconductor package is formed with a third conductive pad and a fourth conductive pad and is disposed over the first semiconductor package. A first conductive connecting member electrically connects the first conductive pad and the third conductive pad. A second conductive connection member electrically connects the second conductive pad and the fourth conductive pad.

4 Claims, 5 Drawing Sheets

(51) Int. Cl.
*H01L 23/52* (2006.01)
*H01L 29/40* (2006.01)
*H01L 23/31* (2006.01)
*H01L 23/00* (2006.01)
*H01L 25/03* (2006.01)
*H01L 25/065* (2006.01)

(52) U.S. Cl.
CPC ............. 2924/19107 (2013.01); *H01L 24/48* (2013.01); *H01L 2924/15321* (2013.01); *H01L 2224/45144* (2013.01); *H01L 24/45* (2013.01); *H01L 2924/014* (2013.01); *H01L 2224/32145* (2013.01); *H01L 25/03* (2013.01); *H01L 24/16* (2013.01); *H01L 2224/45124* (2013.01); *H01L 2225/06517* (2013.01); *H01L 2224/48228* (2013.01); *H01L 2224/73265* (2013.01); *H01L 2225/06565* (2013.01); *H01L 2924/078* (2013.01); *H01L 2224/49175* (2013.01); *H01L 23/3128* (2013.01); *H01L 2225/0651* (2013.01); *H01L 2224/48091* (2013.01); *H01L 2924/01079* (2013.01); *H01L 25/0657* (2013.01); *H01L 2924/01013* (2013.01); *H01L 2224/4911* (2013.01); *H01L 2224/48227* (2013.01); *H01L 2924/15331* (2013.01); *H01L 2224/16227* (2013.01); *H01L 2224/16225* (2013.01); *H01L 2924/01033* (2013.01)
USPC .......... 257/686; 257/738; 257/777; 257/780; 257/784; 257/E25.006

(56) References Cited

U.S. PATENT DOCUMENTS

| | | | |
|---|---|---|---|
| 7,239,164 B2 * | 7/2007 | Tamaki | 257/686 |
| 7,279,361 B2 | 10/2007 | Karnezos | |
| 7,429,798 B2 * | 9/2008 | Kim | 257/778 |
| 7,453,153 B2 * | 11/2008 | Saita et al. | 257/777 |
| 7,479,407 B2 * | 1/2009 | Gehman et al. | 438/109 |
| 7,589,408 B2 * | 9/2009 | Weng et al. | 257/686 |
| 7,642,633 B2 | 1/2010 | Hirose et al. | |
| 7,705,467 B2 * | 4/2010 | Li | 257/777 |
| 7,723,839 B2 * | 5/2010 | Yano et al. | 257/700 |
| 7,745,924 B2 * | 6/2010 | Shioga et al. | 257/700 |
| 8,404,518 B2 * | 3/2013 | Do et al. | 438/109 |
| 2002/0027295 A1 * | 3/2002 | Kikuma et al. | 257/780 |
| 2005/0248019 A1 * | 11/2005 | Chao et al. | 257/686 |
| 2006/0087021 A1 * | 4/2006 | Hirose | 257/686 |
| 2006/0138649 A1 * | 6/2006 | Karnezos | 257/723 |
| 2006/0151865 A1 * | 7/2006 | Han et al. | 257/686 |
| 2006/0170091 A1 * | 8/2006 | Karnezos | 257/686 |
| 2006/0172463 A1 | 8/2006 | Karnezos | |
| 2006/0175715 A1 | 8/2006 | Hirose et al. | |
| 2007/0194427 A1 * | 8/2007 | Choi et al. | 257/686 |
| 2007/0216008 A1 * | 9/2007 | Gerber | 257/686 |
| 2007/0246815 A1 * | 10/2007 | Lu et al. | 257/686 |
| 2007/0278645 A1 * | 12/2007 | Li | 257/686 |
| 2008/0029869 A1 * | 2/2008 | Kwon et al. | 257/686 |
| 2008/0054437 A1 * | 3/2008 | Hwang | 257/686 |
| 2009/0057827 A1 * | 3/2009 | Shioga et al. | 257/532 |
| 2009/0155961 A1 * | 6/2009 | Ko et al. | 438/127 |
| 2009/0243070 A1 * | 10/2009 | Ko et al. | 257/686 |
| 2009/0243072 A1 * | 10/2009 | Ha et al. | 257/686 |
| 2010/0019369 A1 * | 1/2010 | Lee et al. | 257/686 |
| 2010/0084754 A1 * | 4/2010 | Yoo et al. | 257/686 |
| 2010/0090323 A1 * | 4/2010 | Shinoda et al. | 257/686 |
| 2010/0096740 A1 * | 4/2010 | Kim | 257/686 |
| 2010/0102428 A1 * | 4/2010 | Lee et al. | 257/686 |
| 2010/0109138 A1 * | 5/2010 | Cho | 257/686 |
| 2011/0140258 A1 * | 6/2011 | Do et al. | 257/686 |

* cited by examiner 117    115        116  114  112

117  130 115      116  114  112

STACKED PACKAGE

CROSS-RELATED APPLICATION

This application claims priority under 35 USC §119 to Korean Patent Application No. 2010-53643, filed on Jun. 8, 2010 in the Korean Intellectual Property Office (KIPO), the contents of which are herein incorporated by reference in their entirety.

BACKGROUND

1. Field

Exemplary embodiments relate to a stacked package and a method of manufacturing the same. More particularly, exemplary embodiments relate to a stacked package including sequentially stacked semiconductor packages, and a method of manufacturing the stacked package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages. In order to increase a storage capacity of the semiconductor package, a stacked package including sequentially stacked semiconductor packages may be widely studied.

A conventional stacked package may include a first semiconductor package, a second semiconductor package and external terminals. The second semiconductor package may be stacked on the first semiconductor package. The external terminals may be mounted on a lower surface of the second package substrate. The first semiconductor package and the second semiconductor package may be electrically connected with each other via conductive connecting members. The conductive connecting members may include a conductive ball, a conductive wire, etc.

The conductive wire may have a short diameter, so that the conductive wire may be electrically connected between minutely arranged pads of semiconductor packages. However, the thin conductive wire may have a bad electrical connection. Further, the conductive wire may have a signal transmission speed slower than that of the conductive ball.

The conductive ball may have a long diameter compared to the conductive wire, so that the conductive ball may have a good electrical connection and a rapid signal transmission speed. In contrast, the large conductive ball may be electrically connected between the minutely arranged pads of the semiconductor packages. Further, a process for forming the conductive ball may be more complicated than that for forming the conductive wire.

SUMMARY

According to one aspect, the inventive concept is directed to a stacked package for an electronic device. The stacked package includes a first semiconductor package, the first semiconductor package having a first conductive pad and a second conductive pad. A second semiconductor package is disposed over the first semiconductor package, the second semiconductor package having a third conductive pad and a fourth conductive pad. A first conductive connecting member is configured to electrically connect the first conductive pad and the third conductive pad. A second conductive connecting member is configured to electrically connect the second conductive pad and the fourth conductive pad.

In some embodiments, the first connecting member comprises a conductive ball.

In some embodiments, the second connecting member comprises a conductive wire.

In some embodiments, the stacked package is configured such that a first signal can be transmitted through the first conductive connecting member, and a second signal different from the first signal can be transmitted through the second conductive connecting member.

In some embodiments, the first semiconductor package comprises: a first package substrate, the first pad and the second pad being disposed on the first package substrate; a first semiconductor chip arranged on an upper surface of the first package substrate; and a first molding member formed on the first package substrate to at least partially cover the first semiconductor chip.

In some embodiments, the first pad is disposed on a central portion of the upper surface of the first package substrate, and the second pad is disposed on an edge portion of the upper surface of the first package substrate. In some embodiments, the second pad is disposed beyond the second semiconductor package such that the second pad is exposed by the second semiconductor package.

In some embodiments, the second semiconductor package comprises: a second package substrate, the third pad and the fourth pad being disposed on the second package substrate; a second semiconductor chip arranged on an upper surface of the second package substrate; conductive wires configured to electrically connect the second semiconductor chip and the second package substrate; and a second molding member formed on the second package substrate to at least partially cover the conductive wires and the second semiconductor chip.

In some embodiments, external terminals are mounted at a lower surface of the first semiconductor package.

According to another aspect, the inventive concept is directed to a stacked package for an electronic device. The stacked package includes a first semiconductor package, the first semiconductor package comprising a first package substrate, the first package substrate comprising a first conductive pad and a second conductive pad. A second semiconductor package includes a second package substrate, the second package substrate comprising a third conductive pad and a fourth conductive pad, wherein the second semiconductor package is disposed over the first semiconductor package. A conductive ball electrically connects the first conductive pad of the first package substrate and the third conductive pad of the second package substrate. A conductive wire electrically connects the second conductive pad of the first package substrate and the fourth conductive pad of the second package substrate.

In some embodiments, a first molding member is formed on the first package substrate to at least partially cover the first semiconductor chip.

In some embodiments, a second molding member is formed on the second package substrate to at least partially cover the second semiconductor chip.

In some embodiments, external terminals are mounted on a lower surface of the first semiconductor package.

According to another aspect, the inventive concept is directed to a method of manufacturing a stacked package for an electronic device, the method comprising: forming a first semiconductor package, the first semiconductor package having a first conductive pad and a second conductive pad; forming a second semiconductor package, the second semiconductor package having a third conductive pad and a fourth conductive pad; stacking the second semiconductor package on the first semiconductor package; forming a first conductive connecting member between the first pad and the third pad; and forming a second conductive connecting member between the second pad and the fourth pad.

In some embodiments, forming the first conductive connecting member comprises forming a conductive ball between the first pad and the third pad.

In some embodiments, forming the second conductive connecting member comprises electrically connecting the second pad and the fourth pad using a conductive wire.

In some embodiments, the method further comprises mounting external terminals on a lower surface of the first semiconductor package.

In some embodiments, the method further comprises mounting a first semiconductor chip on an upper surface of a first package substrate of the first semiconductor package.

In some embodiments, the method further comprises mounting a second semiconductor chip on an upper surface of a second package substrate of the second semiconductor package.

In some embodiments, forming the first semiconductor package comprises forming a molding member.

BRIEF DESCRIPTION OF THE DRAWINGS

The foregoing and other features and advantages of the inventive concept will be apparent from the detailed description of preferred embodiments of the inventive concept contained herein, as illustrated in the accompanying drawings, in which like reference characters refer to the same parts or elements throughout the different views. The drawings are not necessarily to scale, emphasis instead being placed upon illustrating the principles of the inventive concept. In the drawings, the thickness of layers and regions may be exaggerated for clarity.

DETAILED DESCRIPTION OF THE EMBODIMENTS

Figure 1:
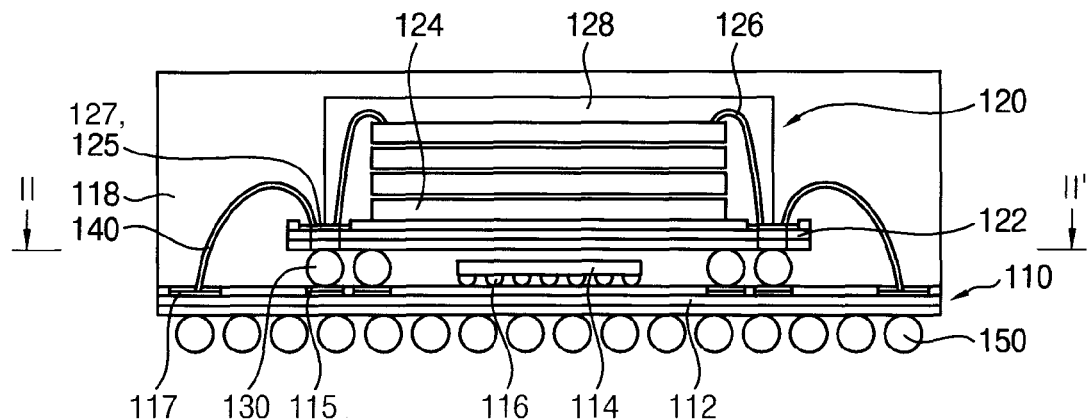
FIG. 1 is a schematic cross-sectional view illustrating a stacked package in accordance with some exemplary embodiments of the inventive concept.

Various exemplary embodiments are described in detail herein with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the present inventive concept to those skilled in the art.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section described below could be termed a second element, component, region, layer or section without departing from the teachings of the present inventive concept.

Spatially relative terms, such as "beneath," "below," "lower," "above," "upper" and the like, may be used herein for ease and clarity of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result of, for example, manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described in detail with reference to the accompanying drawings.

Stacked Package

Figure 2:
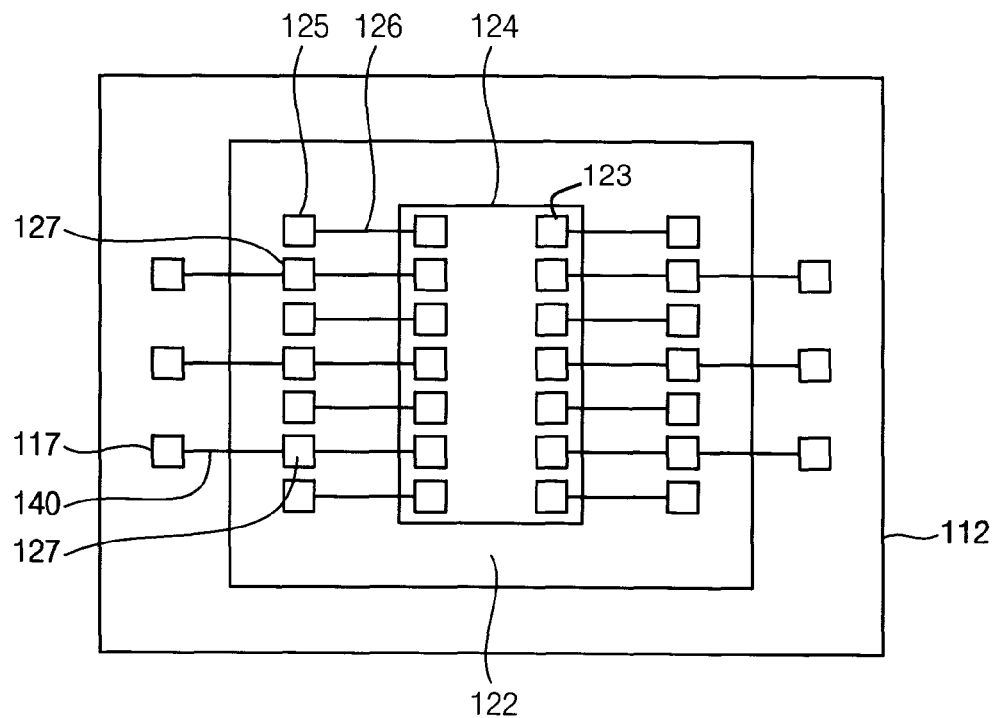
FIG. 2 is a combined schematic partial top view and schematic partial cross-sectional view taken partially along a line II-II' of FIG. 1.

FIG. 1 is a schematic cross-sectional view illustrating a stacked package of an electronic device having semiconductor devices in accordance with some exemplary embodiments of the inventive concept. FIG. 2 is a schematic cross-sectional view taken along a line II-II' of FIG. 1.

Referring to FIGS. 1 and 2, the stacked package 100 of this exemplary embodiment may include a first semiconductor package 110, a second semiconductor package 120 disposed on or above the first semiconductor package 110, first conductive connecting members 130, second conductive connecting members 140 and external terminals 150 for externally connecting the stacked package 100 to external devices and signals.

In some exemplary embodiments, the first semiconductor package 110 may include a first package substrate 112, a first semiconductor chip 114 disposed on or over the first package substrate 112, conductive bumps 116 disposed under the first semiconductor chip 114, and a first molding member 118.

The first package substrate 112 may include first conductive pads 115 and second conductive pads 117 formed at the top surface of the package substrate 112. One or more of the first conductive connecting members 130 may be electrically connected to one or more of the first pads 115, respectively. One or more of the second conductive connecting members 140 may be electrically connected to one or more of the second conductive pads 117, respectively. In some exemplary embodiments, the first conductive pads 115 may be arranged in a predetermined pattern on a central portion of an upper surface of the first package substrate 112. The second conductive pads 117 may be arranged in a predetermined pattern on an edge portion of the upper surface of the first package substrate 112. Thus, the second conductive pads 117 may be located at an outside of the first conductive pads 115. In some specific exemplary embodiments, the second conductive pads 117 may be located on the upper surface of the first package substrate 112 such that the second conductive pads 117 are exposed by the second semiconductor package 120. That is, in these exemplary embodiments, the second conductive pads 117 extend laterally beyond the lateral extents of the second semiconductor package 120.

In some exemplary embodiments, a first signal such as a power signal, a data signal, a clock signal, etc., may be transmitted through one or more of the first conductive pads 115. A second signal such as an address signal, a command signal, etc., may be transmitted through one or more of the second conductive pads 117.

In some exemplary embodiment, the first semiconductor chip 114 may be arranged on or over a central or laterally interior portion of the upper surface of the first package substrate 112. The first semiconductor chip 114 may be electrically connected with the first package substrate 112 via the conductive bumps 116. That is, the conductive bumps 116 may be interposed between the first semiconductor chip 114 and the first package substrate 112. In some exemplary embodiments, the first semiconductor chip 114 may include a controller chip. Further, in some exemplary embodiments, the first semiconductor chip 114 may be or may include a plurality of semiconductor chips. Alternatively, in some exemplary embodiments, the first semiconductor chip 114 and the first package substrate 112 may be electrically connected with each via other conductive wires, which may be used in place of the conductive bumps 116 and/or in addition to the conductive bumps 116.

The first molding member 118 may be formed on, over, and/or at least partially surrounding the first package substrate 112 to cover the first semiconductor chip 114 from the external environment. In some exemplary embodiments, the first molding member 118 may be formed of or include an epoxy molding compound (EMC).

In some exemplary embodiments, the second semiconductor package 120 may be stacked on the first semiconductor package 110. In some exemplary embodiments, the second semiconductor package 120 may include a second package substrate 122, a second semiconductor chip 124 disposed on or over the second package substrate 122, elements such as conductive wires 126 and a second molding member 128.

The second package substrate 122 may include one or more third conductive pads 125 and one or more fourth conductive pads 127 see FIG. 2). In some exemplary embodiments, the second package substrate 122 may have a smaller size than that of the first package substrate 112, as illustrated by the exemplary embodiment of FIGS. 1 and 2. The second package substrate 122 may be arranged on or over the central or laterally interior portion of the upper surface of the first package substrate 112. Thus, the second conductive pads 117 may not be covered by the second package substrate 122. That is, the second package substrate 122 may not extend laterally sufficiently to cover the second conductive pads 117, and, therefore, the second conductive pads 117 may be exposed by the second package substrate 122. The first conductive connecting members 130 may be electrically connected to one or more of the third conductive pads 125. The second conductive connecting members 140 may be electrically connected to one or more of the fourth conductive pads 127. That is, the first conductive pads 115 and the third conductive pads 125 may be electrically connected with each other via the first conductive connecting members 130. The second conductive pads 117 and the fourth conductive pads 127 may be electrically connected with each other via the second conductive connecting members 140. Thus, in some of these exemplary embodiments, the first signal such as a power signal, a data signal, a clock signal, etc., may be transmitted to one or more of the first conductive pads 115 through one or more of the third conductive pads 125 and one or more of the first conductive connecting members 130. Furthermore, in some of these exemplary embodiments, the second signal such as an address signal, a command signal, etc., may be transmitted to one or more of the second conductive pads 117 through one or more of the fourth conductive pads 127 and one or more of the second connecting members 140.

The second semiconductor chip 124 may be arranged on or over the second package substrate 122. The second semiconductor chip 124 may have a plurality of bonding pads 123 formed on or in the second semiconductor chip 124 for electrically connecting to one or more circuits formed on or in the second semiconductor chip 124. The bonding pads may be electrically connected to one or more of the third conductive pads 125 and one or more of the fourth conductive pads 127 via one or more of the conductive wires 126. In some exemplary embodiments, the second semiconductor chip 124 may include at least two semiconductor chips or may be at least two semiconductor chips. In some exemplary embodiments, as illustrated in FIG. 2, the second semiconductor chip 124 actually includes a plurality of stacked semiconductor chips, which, in this particular illustrated exemplary embodiment, includes four stacked semiconductor chips 124. That is, in this detailed description, reference to the second semiconductor chip 124 can refer to a single semiconductor chip or a plurality of stacked semiconductor chips, as illustrated in FIG. 2.

The second molding member 128 may be formed on, over and/or at least partially surrounding the second package substrate 122 to cover the second semiconductor chip 124 to protect the second semiconductor chip 124 from the external environment. In some exemplary embodiments, the second molding member 128 may include or be an EMC.

The first conductive connecting members 130 may be interposed between the first package substrate 112 and the second package substrate 122. One or more of the first conductive connecting members 130 may be electrically connected between one or more of the first conductive pads 115 and one or more of the third conductive pads 125 to transmit the first signal from one or more of the third conductive pads 125 to one or more of the first conductive pads 115. Thus, the first conductive connecting members 130 may have a structure and a material suitable for transmitting the first signal. In some exemplary embodiments, the first conductive connecting members 130 may be and/or may include conductive balls such as solder balls.

The second conductive connecting members 140 may be electrically connected between one or more of the second conductive pads 117 and one or more of the fourth conductive pads 127 to transmit the second signal from one or more of the fourth conductive pads 127 to one or more of the second conductive pads 117. In some exemplary embodiments, the second conductive connecting members 140 may be and/or may include conductive wires such as aluminum wires, gold wires, etc.

In some exemplary embodiments, the first molding member 118 may be formed on, over, and/or at least partially surrounding the first package substrate 112 and the second molding member 128 to cover the first semiconductor package 110, the first connecting members 130 and the second connecting members 140 to protect the first semiconductor package 110, the first connecting members 130 and the second connecting members 140 from the external environment. In some exemplary embodiments, alternatively, the first molding member 118 may not be formed on, above and/or at least partially surrounding the second molding member 128.

The conductive external terminals 150 may be mounted on a lower surface of the first package substrate 112. The conductive external terminals 150 may be electrically connected with one or more of the first pads 115 and one or more of the second pads 117 of the first package substrate 112. In some exemplary embodiments, the external terminals 150 may include solder balls.

According to this exemplary embodiment, the first signal may be transmitted through one or more of the conductive balls, and the second signal may be transmitted through one or more of the conductive wires 140. Thus, the conductive pads may be electrically connected with each other using the conductive connecting members, so that the stacked package may have a small size.

Method of Manufacturing a Stacked Package

FIGS. 3 to 10 are schematic cross-sectional views illustrating a method of manufacturing the stacked package in FIG. 1, according to some embodiments of the inventive concept.

Figure 3:
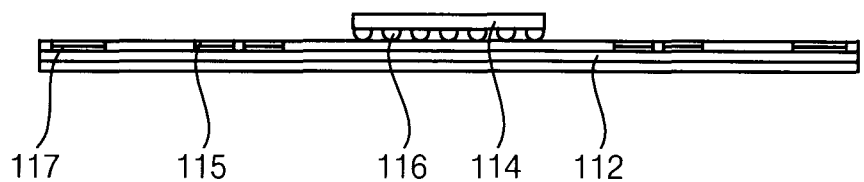
FIGS. 3 to 10 are schematic cross-sectional views illustrating a method of manufacturing the stacked package in FIG. 1, according to some exemplary embodiments of the inventive concept.

Referring to FIG. 3, the conductive balls 116 may be arranged on or above the upper surface of the first package substrate 112. The first semiconductor chip 114 may be arranged on or above the conductive balls 116. A solder reflow process may be performed on the conductive balls 116 to attach the conductive balls 116 to the first semiconductor chip 114 and the first package substrate 112, thereby electrically connecting the first semiconductor chip 114 and the first package substrate 112 with each other, via one or more of the conductive balls 116.

Figure 4:
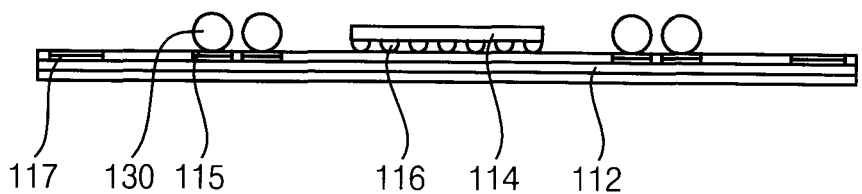

Referring to FIG. 4, one or more first conductive connecting members 130 may be arranged on one or more first conductive pads 115 of the first package substrate 112.

Figure 5:
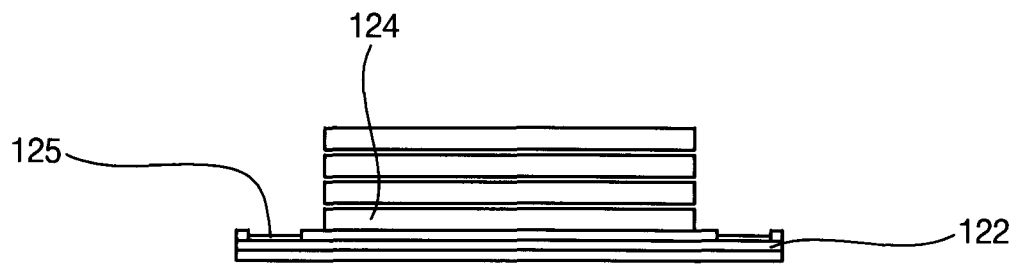

Referring to FIG. 5, the second semiconductor chip 124 may be arranged on or above the upper surface of the second package substrate 122. In some exemplary embodiments, the second semiconductor chip 124 may be attached to the upper surface of the second package substrate 122 using an adhesive (not shown).

Figure 6:
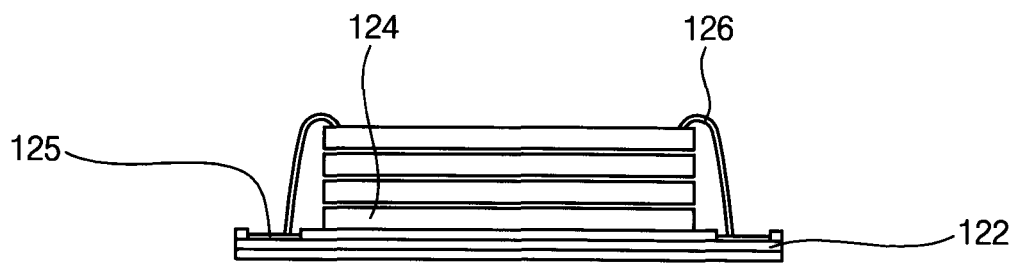

Referring to FIG. 6, one or more of the bonding pads of the second semiconductor chip 124 may be electrically connected with one or more of the third conductive pads 125 and the fourth conductive pads 127 of the second package substrate 122 using one or more of the conductive wires 126.

Figure 7:
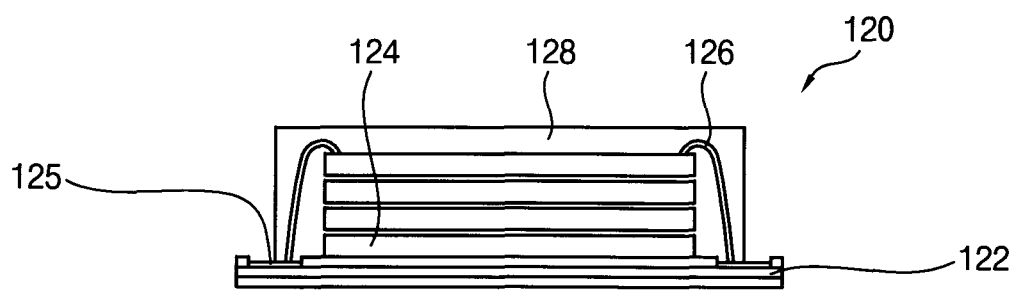

Referring to FIG. 7, the second molding member 128 may be formed on, over and/or at least partially surrounding the second package substrate 122 to cover the second semiconductor chip 124 and the conductive wires 126 to complete the second semiconductor package 120.

Figure 8:
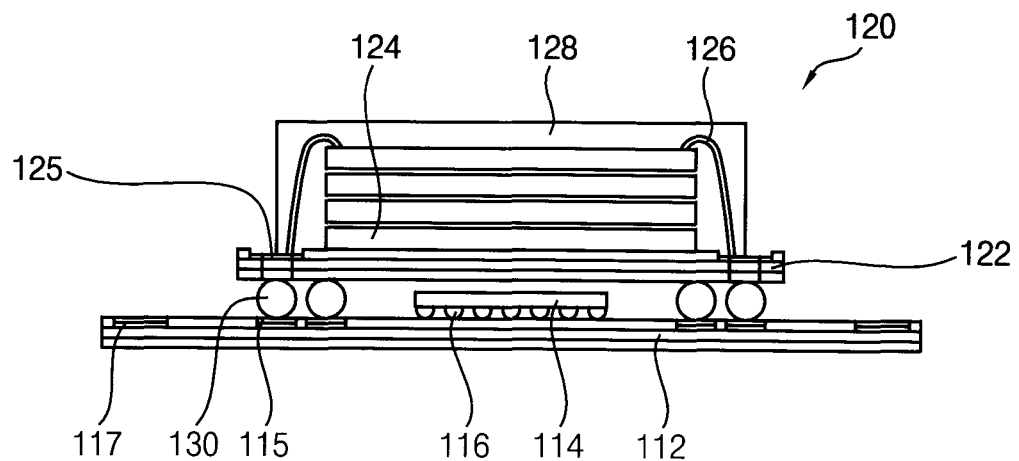

Referring to FIG. 8, the second semiconductor package 120 may be placed on the spherical first conductive connecting members 130. In some exemplary embodiments, the first conductive connecting members 130 may make contact with only the third pads 125 of the second semiconductor package 120. Also, in some embodiments, a diameter or height of the first conductive connecting members 130 is such that, when the second semiconductor package 120 is placed on the first conductive connecting members 130, the second semiconductor package 120 does not make contact with the first semiconductor chip 114.

A solder reflow process may be performed on the first conductive connecting members 130 to attach the first connecting members 130 to the third conductive pads 125 and the first package substrate 112. Thus, the first conductive pads 115 and the third conductive pads 125 may be electrically connected with each other via the first conductive connecting members 130.

Figure 9:
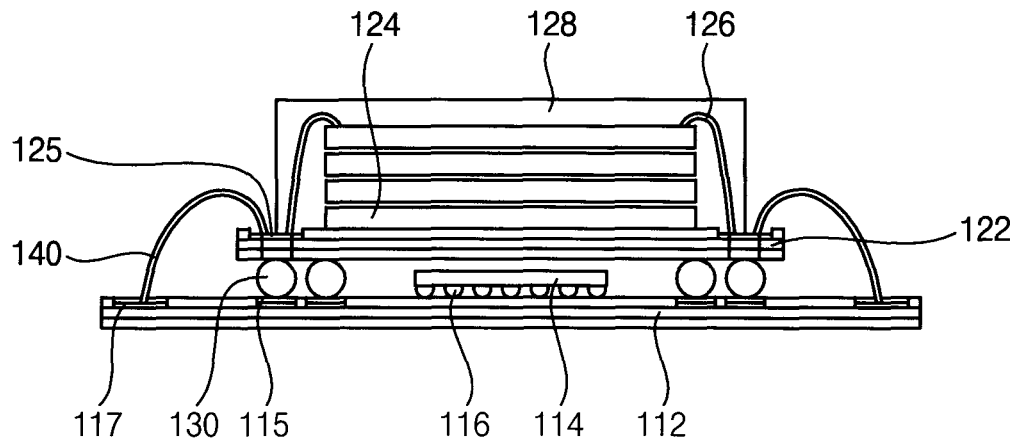

Referring to FIG. 9, the fourth conductive pads 127 of the second package substrate 122 and the second conductive pads 117 of the first package substrate 112 may be electrically connected with each other using the second connecting members 140. In some exemplary embodiments, the second connecting members 140 may include conductive wires, as shown.

Therefore, the first signal such as the power signal, the data signal, the clock signal, etc., may be transmitted to one or more of the first conductive pads 115 through one or more of the third conductive pads 125 and one or more of the first conductive connecting members 130. In contrast, the second signal such as the address signal, the command signal, etc., may be transmitted to one or more of the second conductive pads 117 through one or more of the fourth conductive pads 127 and one or more of the second conductive connecting members 140.

Figure 10:
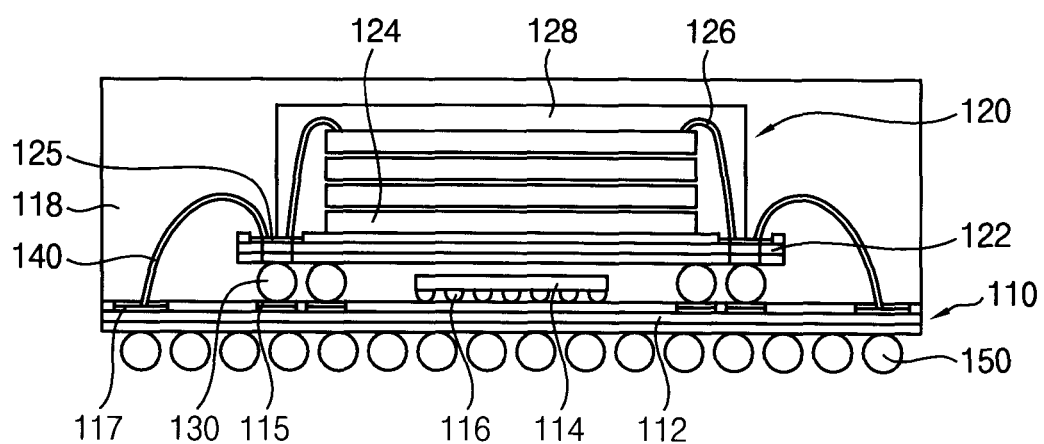

Referring to FIG. 10, the first molding member 118 may be formed on, over and/or at least partially surrounding the first package substrate 112 to cover the first conductive connecting members 130 and the second conductive connecting members 140 to protect the first conductive connecting members 130 and the second conductive connecting members 140 from the external environment and to complete the first semiconductor package 110.

The external terminals 150 may be mounted on the lower surface of the first package substrate 112 to complete the stacked package 100.

According to these exemplary embodiments, the first signal may be transmitted through one or more of the conductive balls, and the second signal may be transmitted through one or more of the conductive wires. Thus, the conductive pads may be electrically connected with each other using the conductive connecting members, so that the stacked package may have a small size.

The foregoing is descriptive and illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims.

What is claimed is:

1. A stacked package for an electronic device, the stacked package comprising:
    a first semiconductor package including a first package substrate, a first semiconductor chip and a first molding member, the first package substrate having first pads and second pads being disposed on an upper surface of the first package substrate, the first semiconductor chip arranged on the upper surface of the first package substrate, and the first molding member formed on the first package substrate to cover the first semiconductor chip;
    a second semiconductor package including a second package substrate, a second semiconductor chip, conductive wires and a second molding member, the second package substrate disposed over the first package substrate and having third pads and fourth pads being disposed on an upper surface of the second package substrate, one of the third pads being disposed directly above one of the first pads, the second semiconductor chip arranged on the upper surface of the second package substrate, the conductive wires configured to electrically connect the second semiconductor chip and the second package substrate, and the second molding member formed on the second package substrate to cover the conductive wires and the second semiconductor chip and covered by the first molding member
    a conductive ball electrically connecting one of the first pads and one of the third pads directly above it and supporting the second semiconductor package above the first semiconductor package; and
    a conductive wire having a diameter less than the conductive ball and electrically connecting one of the second pads and one of the fourth pads, the conductive wire being covered by the first molding member,
    wherein a first signal having a first transmission speed is transmitted through the conductive ball and a second signal having a second transmission speed slower than the first transmission speed is transmitted through the conductive wire.

2. The stacked package of claim 1, wherein the first pads are disposed on a central portion of the upper surface of the first package substrate, and the second pads are disposed on an edge portion of the upper surface of the first package substrate.

3. The stacked package of claim 2, wherein the second pads are disposed beyond the second semiconductor package substrate such that the second pads are exposed by the second semiconductor package substrate.

4. The stacked package of claim 1, further comprising external terminals at a lower surface of the first semiconductor package substrate.

* * * * *